United States Patent
Ito et al.

(10) Patent No.: US 8,202,615 B2
(45) Date of Patent: Jun. 19, 2012

(54) NITROGEN-CONTAINING AMORPHOUS CARBON-TYPE FILM, AMORPHOUS CARBON-TYPE LAMINATION FILM, AND SLIDING MEMBER

(75) Inventors: Hirotaka Ito, Kobe (JP); Kenji Yamamoto, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 0 days.

(21) Appl. No.: 13/058,138

(22) PCT Filed: Aug. 12, 2009

(86) PCT No.: PCT/JP2009/064259
§ 371 (c)(1), (2), (4) Date: Feb. 8, 2011

(87) PCT Pub. No.: WO2010/021285
PCT Pub. Date: Feb. 25, 2010

(65) Prior Publication Data
US 2011/0143976 A1    Jun. 16, 2011

(30) Foreign Application Priority Data

Aug. 19, 2008 (JP) ................................. 2008-210670
Jul. 10, 2009 (JP) ................................. 2009-163659

(51) Int. Cl.
*B32B 9/00* (2006.01)
(52) U.S. Cl. .................. 428/408; 123/41.71; 123/188.1; 428/212; 428/217; 428/704
(58) Field of Classification Search .................. 428/212, 428/217, 408, 704; 123/41.71, 188.11
See application file for complete search history.

(56) References Cited

U.S. PATENT DOCUMENTS

| | | | | |
|---|---|---|---|---|
| 5,026,415 A | * | 6/1991 | Yamamoto et al. | 106/38.28 |
| 5,352,524 A | * | 10/1994 | Nagata | 428/408 |
| 5,837,357 A | * | 11/1998 | Matsuo et al. | 428/212 |
| 5,942,317 A | * | 8/1999 | White | 428/212 |
| 6,245,417 B1 | * | 6/2001 | Huang | 428/408 |

(Continued)

FOREIGN PATENT DOCUMENTS

JP      11 130590     5/1999

(Continued)

OTHER PUBLICATIONS

Franceschini, D. F. et al., "Internal Stress Reduction by Nitrogen Incorporation in Hard Amorphous Carbon Thin Films", Appl. Phys. Lett, vol. 60, No. 26, pp. 3229-3231, ISSN: 0003-6951, (Jun. 29, 1992).

(Continued)

*Primary Examiner* — Archene Turner
(74) *Attorney, Agent, or Firm* — Oblon, Spivak, McClelland, Maier & Neustadt, L.L.P.

(57) ABSTRACT

Provided is a nitrogen-containing amorphous carbon film exhibiting excellent durability even when formed on the surface of a sliding member used under high surface pressure or under a lubricating oil environment. The nitrogen-containing amorphous carbon film is formed by physical evaporation onto the sliding surface of a sliding member and contains 8.0 to 12.0 atomic % of hydrogen and 3.0 to 14.0 atomic % of nitrogen. The nitrogen-containing amorphous carbon film is effective when, for instance, formed on at least one sliding surface of a sliding member, such as a sliding part of an automobile engine.

20 Claims, 1 Drawing Sheet

U.S. PATENT DOCUMENTS

| | | | |
|---|---|---|---|
| 6,312,798 B1 * | 11/2001 | Ma et al. | 428/408 |
| 6,562,445 B2 * | 5/2003 | Iwamura | 428/217 |
| 6,652,969 B1 * | 11/2003 | Murakami et al. | 428/408 |
| 6,844,068 B1 | 1/2005 | Miyake et al. | |
| 7,537,835 B2 * | 5/2009 | Mori et al. | 428/408 |
| 2004/0234770 A1 | 11/2004 | Mori et al. | |

FOREIGN PATENT DOCUMENTS

| | | | |
|---|---|---|---|
| JP | 2000 297373 | | 10/2000 |
| JP | 2002-115061 | * | 4/2002 |
| JP | 2005 015852 | | 1/2005 |
| JP | 2007-160506 | * | 6/2007 |
| WO | 00/75394 | * | 12/2000 |
| WO | 03 029685 | | 4/2003 |

OTHER PUBLICATIONS

Rabbani, F. et al., "Stress Reduction in A-C:H Coatings Through the Addition of Nitrogen to the Feed Gas", Diamond and Related Materials, vol. 13, pp. 1645-1657, ISSN: 0925-9635, (Apr. 15, 2004).

Wu, R. L. C. et al., "Growth and Tribological Properties of Amorphous Hydrogenated Carbon Nitride Produced by Ion-Beam Technique", Surface and Coatings Technology, vol. 120-121, pp. 573-578, ISSN: 0257-8972, (1999).

International Search Report Issued Nov. 24, 2009 in PCT/JP09/064259 filed Aug. 12, 2009.

* cited by examiner

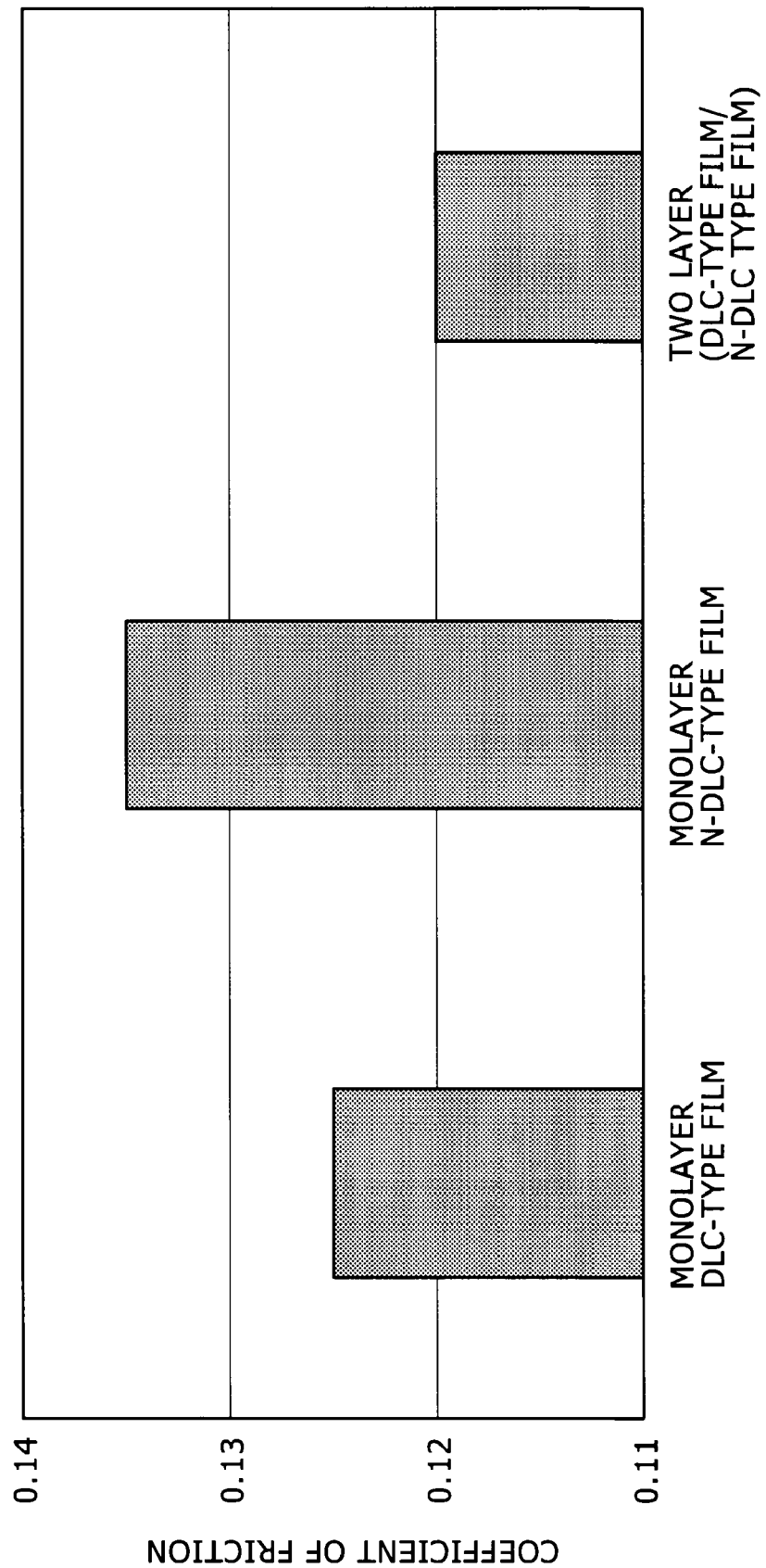

NITROGEN-CONTAINING AMORPHOUS CARBON-TYPE FILM, AMORPHOUS CARBON-TYPE LAMINATION FILM, AND SLIDING MEMBER

TECHNICAL FIELD

The present invention relates to a nitrogen-containing amorphous carbon-type film, an amorphous carbon-type lamination film, and a sliding member including the nitrogen-containing amorphous carbon-type film or the amorphous carbon-type lamination film formed on the sliding surface thereof.

BACKGROUND ART

As a hard film, an amorphous carbon film is known. The amorphous carbon has an intermediate merged structure between that of diamond and that of graphite, and is also referred to as hard amorphous carbon, indefinite carbon, hard indefinite carbon, i-carbon, diamond-form carbon, diamond-like carbon (DLC), or the like. The amorphous carbon (which may be hereinafter referred to as DLC) is, as with diamond, high in hardness, and is excellent in wear resistance, solid lubricity, thermal conductivity, and chemical stability. For this reason, amorphous carbon has come into use as each protective film of various components such as sliding members, dies, cutting tools, wear-resistant mechanical components, polishing materials, and magnetic/optical components. Amorphous carbon has features of being chemically inactive and having a low reactivity with nonferrous metals, and has come into practical use as a coating film of a cutting tool for aluminum or copper materials particularly taking advantage of these features.

The methods for manufacturing the amorphous carbon film are largely divided into two kinds of a PVD (Physical Vapor Deposition) method and a CVD (Chemical Vapor Deposition) method. With deposition by the CVD method, as advantages, mention may be made of high deposition rate and coatability on a substance in complicated shape. However, with deposition by the CVD method, the amorphous carbon film is manufactured by decomposing a hydrocarbon gas. For this reason, the amount of hydrogen mixed into the amorphous carbon film is large. Thus, it is unfavorably difficult to enhance the hardness of the amorphous carbon film as expected.

On the other hand, with deposition by the PVD method, by not using a hydrocarbon gas, or setting the amount of hydrocarbon gas to be introduced during deposition at a trace amount, it is possible to manufacture an amorphous carbon film not containing hydrogen or having a low hydrogen content.

There is proposed a technology of forming a nitrogen-containing amorphous carbon-type film using the methods, and improving the characteristics thereof than those of an amorphous carbon film. For example, Patent Literature 1 proposes the following technology: on the assumption that a sliding member is used under dry environment, a nitrogen-containing amorphous carbon-type film is formed on the sliding surface of the member, and the atmosphere in the periphery of the sliding part during sliding is set to be a nitrogen atmosphere, thereby preventing oxidation of carbon in the film.

Further, for example, Patent Literature 2 proposes the following technology: a nitrogen-containing amorphous carbon-type film and a layer including a IVa group element in the periodic table, or the like are stacked, or the IVa group element in the periodic table or the like is dispersed in the nitrogen-containing amorphous carbon-type film, thereby to reduce the coefficient of friction.

CITATION LIST

Patent Literature

[PTL 1] JP-A-2002-339056
[PTL 2] JP-A-2000-192183

As described above, a nitrogen-containing amorphous carbon-type film is proposed. However, the technology described in PTL 1 requires setting of a nitrogen atmosphere in the periphery of the sliding part during sliding. For this reason, the technology is not suitable for sliding members for use under a high pressure of contacted surface or under oil-lubricated environment. Further, in PTL 1, without using a hydrocarbon gas, an amorphous carbon-type film not containing hydrogen is formed. However, when such a film is used under a high pressure of contacted surface or the like, the film supposedly tends to be embrittled as described later. Therefore, in order to obtain an amorphous carbon-type film exhibiting excellent sliding characteristics even when formed on the sliding surface of a sliding member for use under a high pressure of contacted surface or under oil-lubricated environment, a further improvement is required.

Whereas, in PTL 2, an optimum sliding member for use under oil-lubricated environment is studied, but severe sliding conditions such as conditions under a high pressure of contacted surface are not assumed. Further, in PTL 2, it is described to the effect that the film can also be formed with a CVD method. However, with the CVD method, it is unfavorably difficult to appropriately control the hydrogen content and the hardness. Further, although the nitrogen content in the film is not specifically shown, in order to implement a sliding member usable even under a high pressure of contacted surface or under oil-lubricated environment, it is necessary to strictly control the components (hydrogen content and nitrogen content) of the film.

DISCLOSURE OF THE INVENTION

The present invention was completed in view of such circumstances. It is an object of the present invention to provide a sliding member usable even under a high pressure of contacted surface or under oil-lubricated environment, and a nitrogen-containing amorphous carbon-type film exhibiting excellent sliding characteristics (seizure resistance and wear resistance) when formed on the surface of the sliding member. Further, it is another object of the present invention to provide an amorphous carbon-type lamination film which exhibits excellent sliding characteristics when formed on the surface of the sliding member, and has a small coefficient of friction.

The nitrogen-containing amorphous carbon-type film in accordance with the present invention is a nitrogen-containing amorphous carbon-type film formed on the sliding surface of a sliding member by a PVD method (physical vapor deposition method). The film is characterized by including hydrogen in an amount of 8.0 at % or more and 12.0 at % or less, and nitrogen in an amount of 3.0 at % or more and 14.0 at % or less.

In accordance with the nitrogen-containing amorphous carbon-type film of the present invention, it is preferable that the ratio (H/E) of the hardness H (GPa) and the Young's modulus E (GPa) measured with a nanoindentation method exhibits 0.070 or more and 0.080 or less.

In the present invention, there is also included an amorphous carbon-type lamination film having the nitrogen-containing amorphous carbon-type film and an amorphous carbon-type film containing hydrogen in an amount of 5.0 at % or more and 25 at % or less, and substantially not containing nitrogen, formed immediately thereunder. As the amorphous carbon-type lamination film, mention may be also made of a lamination of two or more pairs of lamination combinations including the nitrogen-containing amorphous carbon-type film and the amorphous carbon-type film.

In the present invention, there is also further included a sliding member including the amorphous carbon-type film or the amorphous carbon-type lamination film formed on at least one sliding surface. Examples of the sliding member may include sliding components of an automobile engine.

The nitrogen-containing amorphous carbon-type film of the present invention contains prescribed amounts of hydrogen and nitrogen. For this reason, even when the nitrogen-containing amorphous carbon-type film is formed on the sliding surface of a sliding member for use under a high pressure of contacted surface or under oil-lubricated environment, the film exhibits excellent seizure resistance and wear resistance (these characteristics may be generically referred to as "sliding characteristics") during sliding. Further, the amorphous carbon-type lamination film of the present invention exhibits an excellent wear resistance resulting from the nitrogen-containing amorphous carbon-type film, and has a small coefficient of friction.

BRIEF DESCRIPTION OF THE DRAWING

FIG. 1 is a graph showing comparison in coefficients of friction among respective films.

BEST MODE FOR CARRYING OUT THE INVENTION

As described above, with the PVD method, it is possible to form an amorphous carbon-type film not containing hydrogen or having a low hydrogen content. Thus, it is possible to enhance the hardness of the amorphous carbon-type film. As a result, when the film is formed on the sliding surface of a sliding member, the durability of the sliding member can be expected to be improved. However, for the amorphous carbon-type film having a high hardness and a low hydrogen content, the film internal stress also increases in proportion to the increase in hardness. Accordingly, the brittleness of the film tends to increase. Therefore, when such a film is used under environment of a high pressure of contacted surface, the breakage of the film tends to proceed. This may rather result in lower durability than that of a film low in hardness. In addition, when the hardness is too high, the aggressiveness to the mating material is high, which promotes the wear of the mating material according to the kind of the mating material of the sliding part. This may incur reduction of the life of the sliding member.

Under such circumstances, for the purpose of implementing an amorphous carbon-type film which exhibits excellent sliding characteristics even when formed on the surface of a sliding member for use under a high pressure of contacted surface or under oil-lubricated environment, the present inventors conducted a close study.

As a result, first, the present inventors found that the sliding characteristics (seizure resistance and wear resistance) of the amorphous carbon-type film are affected by the hardness of the film and the H/E of the film (the ratio of the hardness H (GPa) and the Young's modulus E (GPa) measured with a nanoindentation method), shown in Examples described later. Then, the present inventors conducted a study on the relationship between the sliding characteristics of the film and the hardness and H/E of the film. As a result, the present inventors revealed that the sliding characteristics of the amorphous carbon-type film become more excellent with an increase in hardness of the film and with a decrease in H/E thereof.

Thus, for the purpose of obtaining an amorphous carbon-type film exhibiting excellent sliding characteristics, the present inventors conducted a study on a specific means for implementing an amorphous carbon-type film having a high hardness and a small H/E. As a result, the present inventors found that a nitrogen-containing amorphous carbon-type film containing given amounts of both of hydrogen and nitrogen is desirable. This led to the present invention. Below, the nitrogen-containing amorphous carbon-type film (which may be referred to as an "N-DLC-type film") of the present invention will be described in details.

[Regarding N-DLC-Type Film]

First, the H/E examined for a conventional amorphous carbon-type film not containing nitrogen was found to be within the range of 0.090 to 0.100. However, for a nitrogen-containing amorphous carbon-type film containing nitrogen in an amount of 3.0 at % or more, the H/E was found to be 0.080 or less. This indicates that the film containing nitrogen shows a lower H/E than that of the amorphous carbon-type film not containing nitrogen. Thus, a given or more nitrogen content reduces the H/E. This is considered to be due to the following reason: addition of nitrogen reduces the hardness to a certain degree, but does not reduce the Young's modulus very much.

Thus, the nitrogen-containing amorphous carbon-type film showing a low H/E is considered to be more excellent in sliding characteristics than an amorphous carbon-type film showing a higher H/E and the same hardness. However, in actuality, when an amorphous carbon-type film is allowed to contain nitrogen, the hardness of the film also tends to be reduced with the H/E. Thus, the present inventors further conducted a study, and found the following fact: when the film is allowed to contain hydrogen in an amount in the vicinity of 10 at % with the nitrogen, it is possible to reduce the H/E while setting the hardness of the film at a given or higher level (the hardness measured by the method shown in Examples described later is, for example, 15 GPa or more). As a result, it is possible to implement excellent seizure resistance and wear resistance. Below, the contents of nitrogen and hydrogen in the N-DLC-type film of the present invention will be described in details.

<Nitrogen Content in N-DLC-Type Film: 3.0 at % or More and 14.0 at % or Less>

In order to reduce the H/E and sufficiently improve the brittle fracture characteristics of the N-DLC-type film as described above, the N-DLC-type film of the present invention contains nitrogen in an amount of 3.0 at % or more, and more preferably in an amount of 4.0 at % or more. The H/E tends to be reduced with an increase in nitrogen content. However, a too high nitrogen content makes it impossible to ensure a high hardness even when the hydrogen content is controlled as described below, rather resulting in reduction of the sliding characteristics of the film. Accordingly, the nitrogen content in the N-DLC-type film is 14.0 at % or less, and more preferably 11 at % or less.

<Hydrogen Content in N-DLC-Type Film: 8.0 at % or More and 12.0 at % or Less>

The N-DLC-type film of the present invention contains therein hydrogen in an amount in the vicinity of 10 at %, i.e., within the range of 8.0 at % or more and 12.0 at % or less in order to prevent reduction of the hardness due to inclusion of nitrogen as described above. A study by the present inventors has revealed the following: when the amount of hydrogen to be contained is about 10 at %, the hardness (H) exhibits the maximum value; whereas, when the content departs from the vicinity of 10 at %, i.e., the hydrogen content is less than 8.0 at %, or more than 12.0 at %, the hardness of the film is sharply reduced. In the present invention, the preferred lower limit of the hydrogen content is 9 at %, and the preferred upper limit is 11.0 at %.

The N-DLC-type film of the present invention contains hydrogen and nitrogen in the foregoing amounts, and a balance of carbon and inevitable impurities. As the inevitable impurities, mention may be made of Ar and the like which may be inevitably mixed in the manufacturing step.

For the N-DLC-type film of the present invention, preferably, the hardness (H) is 15 GPa or more, and the H/E is within the range of 0.070 to 0.080. Presumably, the H/E is basically affected only by the nitrogen content, and is not affected by the manufacturing conditions not affecting the nitrogen content, and the hydrogen content.

The film thickness of the N-DLC-type film has no particular restriction. However, when the film thickness of the N-DLC-type film is too small, the initial wear in the running-in process at the early stage of sliding causes elimination of the N-DLC-type film. Accordingly, the base material is exposed, so that seizure becomes more likely to occur. For this reason, the film thickness of the N-DLC-type film is preferably 0.5 μm or more. On the other hand, from the viewpoints of reducing the coefficient of friction and the wear amount, and enhancing the seizure contacted surface pressure, the film thickness of the N-DLC-type film is desirably increased. However, when the film thickness is too large, the film becomes more likely to be peeled. For this reason, the film thickness of the N-DLC-type film is preferably set at 1.0 μm or less.

Further, in the present invention, the formation method (deposition method) of the N-DLC-type film has no particular restriction so long as it is a physical vapor deposition method (PVD method). However, in the PVD method, the following conditions are recommended to be adopted. Namely, a sputtering method or an arc method using a solid carbon source is recommended. Particularly, deposition with a sputtering method is recommended. Specifically, mention may be made of the following procedure: for example, by using a solid carbon source, a mixed gas of Ar or nitrogen, and hydrocarbon gases (e.g., methane and acetylene) is introduced into a vacuum chamber; thus, by a sputtering method, the N-DLC-type film is formed.

The hydrogen content in the N-DLC-type film is roughly controlled by the charging amount of hydrocarbon gases. However, even when the total amount of hydrogen charged is the same, use of a hydrocarbon gas having a larger number of hydrogen atoms contained per molecule tends to increase the hydrogen content in the N-DLC-type film. Further, the hydrogen content in the N-DLC-type film also depends upon the bias voltage during deposition. As a general tendency, even when methane is charged in an equal amount, the bias voltage is set high. As a result, the hydrogen content in the N-DLC-type film tends to be decreased. By controlling these conditions for deposition, it is possible to set the hydrogen content in the N-DLC-type film within the foregoing range.

Whereas, the nitrogen content in the N-DLC-type film is controllable by controlling the gas flow rate ratio of the nitrogen gas to be introduced during deposition (incidentally, the flow rate ratio of a nitrogen gas occupying the total gases=volume ratio=partial pressure ratio). Also for the nitrogen content, as a general tendency, when the bias voltage is set high, the nitrogen content in the N-DLC-type film tends to be decreased. By controlling the conditions for deposition, it is possible to set the nitrogen content in the N-DLC-type film within the foregoing range.

[Regarding Amorphous Carbon-Type Lamination Film Containing the N-DLC-Type Film]

As described above, the N-DLC-type film is excellent in wear resistance and the like. However, the coefficient of friction of the N-DLC-type film tends to be slightly larger than that of a DLC-type film not containing nitrogen.

Herein, the present inventors found the following: with an amorphous carbon-type lamination film having a lamination structure (which may be hereinafter referred to as a "lamination film") of the N-DLC-type film, and an amorphous carbon-type film containing hydrogen in an amount of 5.0 at % or more and 25 at % or less, and substantially not containing nitrogen, formed immediately thereunder (which may be hereinafter referred to as a "DLC-type film"), the coefficient of friction is smaller than that of the N-DLC-type film (monolayer) or the DLC-type film (monolayer).

The mechanism by which the coefficient of friction is reduced by the formation of the lamination structure is not clear. Probably, as wear of the lamination film proceeds due to sliding, the wear particles generated due to wear of the N-DLC-type film, and the wear particles generated due to wear of the DLC-type film are mixed to be present on the sliding surface. The conditions of the sliding surface are considered to contribute to reduction of the coefficient of friction. Therefore, it is preferable that the N-DLC-type film and the DLC-type film are stacked. Further, in order to increase the boundary surface between the N-DLC-type film and the DLC-type film, and to more enhance the operational effects, it is preferable that two or more pairs of lamination combinations including these films are stacked. Namely, it is preferable to adopt a structure in which N-DLC-type films and DLC-type films are alternately and successively stacked.

The DLC-type film contains hydrogen in an amount of 5.0 at % or more and 25 at % or less. When the hydrogen content in the DLC-type film is too small, the film becomes brittle, and tends to be fractured upon sliding (particularly, upon sliding under a high pressure of contacted surface). Accordingly, the hydrogen content in the DLC-type film is 5.0 at % or more, and more preferably 8.0 at % or more. On the other hand, when the hydrogen content in the DLC-type film is too large, the hardness is reduced. For this reason, the hydrogen content is 25 at % or less, and more preferably 12.0 at % or less.

Further, the wording "substantially not containing nitrogen" means that the nitrogen content in the DLC-type film is 0.1 at % or less (inclusive of 0 at %).

As the DLC-type film of the present invention, mention may be made of a film containing the foregoing amount of hydrogen, substantially not containing nitrogen as described above, and having a balance of carbon and inevitable impurities. As inevitable impurities, mention may be made of Ar and the like which may be inevitably mixed during the manufacturing step.

The DLC-type film and/or the N-DLC-type film may further contain one or more metal elements and/or semimetal elements selected from the group consisting of group 4A elements, group 5A elements, group 6A elements, Fe, Si, Al, and B. The contents of the metal elements and/or the semimetal elements have no particular restriction. For example, the ratio of the metal elements and/or the semimetal elements relative to the total of carbon contained in the DLC-type film and/or the N-DLC-type film, and the metal elements and/or the semimetal elements is set at 2 at % or more and 20 at % or less.

In the case of the lamination film, preferably, the film thickness of the DLC-type film is 0.2 µm or more and 5.0 µm or less, and the film thickness of the N-DLC-type film is 0.01 µm or more and 1.0 µm or less. When the film thickness of the DLC-type film is less than 0.2 µm, upon wear of the N-DLC-type film, and exposure of the DLC-type film, the DLC-type film is not sufficient in durability, and is reduced in durability life. The film thickness of the DLC-type film is more preferably 0.5 µm or more. On the other hand, when the film thickness of the DLC-type film exceeds 5.0 µm, the film internal stress increases, so that the film becomes brittle. The film thickness of the DLC-type film is more preferably 2.0 µm or less.

Whereas, when the film thickness of the N-DLC-type film is less than 0.01 µm, the wear particles generated due to wear of the N-DLC-type film are not sufficient, resulting in a small effect of reducing the coefficient of friction. The film thickness of the N-DLC-type film is more preferably 0.05 µl or more. On the other hand, when the film thickness of the N-DLC-type film exceeds 1.0 µm, the internal stress of the N-DLC-type film is high. Thus, peeling tends to occur at the interface with the DLC-type film. The film thickness of the N-DLC-type film is more preferably 0.5 µm or less.

In the case of a multilayer structure including two or more pairs of lamination combinations including the DLC-type films and the N-DLC-type films repeatedly stacked, the foregoing film thicknesses are not limiting, but even various film thicknesses are effective.

The formation method (deposition method) of the amorphous carbon-type lamination film has no particular restriction so long as it forms the N-DLC-type film forming the lamination film with a physical vapor deposition method (PVD method). The recommended deposition conditions for the N-DLC-type film are as described above.

Further, the formation method of the DLC-type film forming the lamination film may be either of a PVD method and a CVD method. However, as with the N-DLC-type film, a sputtering method or an arc method using a solid carbon source is recommended. Particularly, deposition with a sputtering method is recommended. Specifically, for example, using a solid carbon source, a mixed gas of Ar and hydrocarbon gases (e.g., methane and acetylene) is introduced into a vacuum chamber to form the DLC-type film by a sputtering method. Control of the hydrogen content in the DLC-type film can be carried out in the same manner as with control of the hydrogen content in the N-DLC-type film.

Incidentally, when the deposition methods of the DLC-type film and the N-DLC-type film forming the lamination film are the same, the lamination film can be formed with efficiency by changing only the type of gases to be used.

As the sliding members of the present invention, mention may be made of sliding members including two types of components to be in contact with each other, specifically, for example, automobile engine cam and shim, valve lifter, piston ring, piston pin, rocker arm, and connecting rod. The N-DLC-type film and the lamination film of the present invention may be formed on one or both of the sliding surfaces of the sliding members according to the lubrication environment and the sliding conditions.

The base materials of the sliding members have no particular restriction. For example, there can be used hard metals, iron system alloys such as stainless steel, alloy tool steel, and high speed tool steel, titanium system alloys, aluminum system alloys, copper system alloys, ceramics such as glass and alumina, and resins.

Incidentally, between the base material and the N-DLC-type film or the lamination film of the present invention, a metal film or an inorganic metal compound film may be formed as an intermediate layer (underlayer). The formation of the intermediate layer is carried out in such a range as not to impair the durability of the sliding members and the like for improving the adhesion between the N-DLC-type film or the lamination film and the base material, or other purposes. As the intermediate layer, a film including, for example, an elemental substance of Si, Ti, Zr, Cr, W, or Mo, or an oxide, a nitride, or a carbide thereof, or the like may be formed with a total thickness of about 0.1 to 1 µm. The formation method of the intermediate layer has no particular restriction. However, as with the N-DLC-type film and the lamination film, formation with a sputtering method or an arc method is recommended.

EXAMPLES

Below, the present invention will be described more specifically by way of examples. However, the present invention is naturally not limited by the following examples. Appropriate changes may be made within the scope adaptable to the gists described above and below to execute the present invention. These are all included in the technical scope of the present invention.

Example 1

As a PVD device, using an unbalanced type magnetron sputtering device with a carbon target (target diameter 6 inch) as an evaporation source (UBM202, manufactured by Kobe Steel, Ltd.), amorphous carbon-type films shown in Table 1 were deposited. When an intermediate layer described later is formed, a Cr target is further used. For deposition of the amorphous carbon-type film, a mixed gas of Ar (argon), $CH_4$ (methane), and $N_2$ (nitrogen) was used.

As a base material, for analysis of the hydrogen content and the nitrogen content, a Si substrate was used; for evaluation of the hardness and the Young's modulus, a mirror-surface-polished hard metal; and for sliding test evaluation, a mirror-surface-polished SKH51 disk.

The base material was introduced in the device. Evacuation was carried out to $1 \times 10^{-3}$ Pa or less, and heating was carried out until the base material temperature was 400° C. Then, sputtering cleaning using Ar ions was carried out. Then, for a sample including the hard metal as the base material, or the one including the SKH51 disk as the base material, first, a Cr film and a Cr carbide film were sequentially formed as the intermediate layer on the substrate. As a result, the adhesion between the base material and each amorphous carbon-type film of Table 1 to be deposited next was ensured.

As the intermediate layer, the Cr film was formed using a Cr target in a pure Ar atmosphere with a sputtering method. Whereas, the Cr carbide film was formed by gradually reducing the input electric power to the Cr target, and increasing the input electric power to a carbon target in an Ar—$CH_4$ (5%) atmosphere. As the thickness of the intermediate layer, the thickness of the Cr film was set at 0.3 µm, and the thickness of the Cr carbide film was set at 0.7 µm. Then, on the surface of the intermediate layer, each amorphous carbon-type film of Table 1 was formed. Incidentally, in the case of the Si substrate, each amorphous carbon-type film of Table 1 was directly formed on the substrate.

The formation of each amorphous carbon-type film of Table 1 was performed in the following manner: the input electric power to the target was fixed at 1.0 kW, and the flow rates of Ar, CH$_4$, and N$_2$ were changed as shown in Table 1 to control the hydrogen content and the nitrogen content. Deposition was performed by setting the total pressure at 0.6 Pa, and setting the bias voltage applied to the substrate during deposition constant at −100 V. In any case using any base material, a film with a film thickness of about 1 μm was formed.

Thus, there were formed samples including the amorphous carbon-type films of Table 1 with various hydrogen contents and nitrogen contents formed therein. By using the samples, there were performed analysis of the hydrogen content and the nitrogen content of the film, measurement of the hardness and the Young's modulus of the film, and a sliding test thereof.

The hydrogen content (atomic % (at %)) and the nitrogen content (atomic % (at %)) in each amorphous carbon-type film shown in Table 1 were determined by measurement with ERDA (Elastic Recoil Detection Analysis) using a sample in which the amorphous carbon-type film was directly formed on a Si substrate with no intermediate layer therebetween.

mm$^2$/s in kinematic viscosity at room temperature) was coated on the disk. Thus, a 10000-m sliding test was carried out.

In the sliding test, from the point in time at which the sliding speed became 1.0 m/s and the vertical load became 200 N after 10-minute running-in, 10000-m sliding was carried out. Then, the sliding distance until the point in time at which the coefficient of friction exceeded 0.3 was referred to as the distance until the start of seizure. The durability was evaluated by the distance. Whereas, a sample not undergone seizure even after 10000-m sliding was evaluated as having achieved 10000-m sliding. The wear amount of the film at the time point was measured. The wear amount was determined in the following manner: the cross-sectional areas of the wear part determined from the cross-sectional profile of the wear part were measured at four points at equal intervals by 90°, and the mean value was calculated. Then, a sample with a small wear amount was evaluated as being excellent in durability.

These results are shown in Table 1.

TABLE 1

|  | Gas flow rate (sccm) | | | Composition (at %) | | Hardness H (GPa) | Young's modulus E (GPa) | H/E (—) | Distance until start of seizure (m) | Wear amount (μm$^2$) |
| --- | --- | --- | --- | --- | --- | --- | --- | --- | --- | --- |
|  | Ar | CH$_4$ | N$_2$ | H | N |  |  |  |  |  |
| Comparative example 1 | 100 | 0 | 0 | 0.0 | 0.0 | 25 | 254 | 0.096 | 1240 | — |
| Comparative example 2 | 99 | 0.5 | 0 | 5.2 | 0.0 | 30 | 312 | 0.097 | 7561 | — |
| Comparative example 3 | 99 | 0.5 | 5 | 4.0 | 9.3 | 16 | 224 | 0.071 | 4335 | — |
| Comparative example 4 | 99 | 1 | 0 | 11.0 | 0.0 | 33 | 326 | 0.101 | 10000 | 110 |
| Inventive example 1 | 99 | 1 | 1 | 11.0 | 4.0 | 24 | 322 | 0.073 | 10000 | 11 |
| Inventive example 2 | 99 | 1 | 3 | 10.0 | 10.0 | 21 | 284 | 0.072 | 10000 | 17 |
| Inventive example 3 | 99 | 1 | 5 | 8.5 | 13.0 | 18 | 231 | 0.078 | 10000 | 29 |
| Comparative example 5 | 99 | 1 | 10 | 7.5 | 16.0 | 13 | 215 | 0.063 | 10000 | 64 |
| Comparative examples 6 | 99 | 1 | 15 | 5.3 | 21.5 | 10 | 171 | 0.061 | 10000 | 103 |
| Comparative example 7 | 99 | 1 | 20 | 4.1 | 24.4 | 9 | 142 | 0.060 | 8854 | — |
| Comparatrve example 8 | 95 | 5 | 5 | 24.5 | 11.5 | 14 | 180 | 0.080 | 10000 | 104 |

The results are shown in Table 1. Incidentally, in each amorphous carbon-type film in Table 1, trace amounts of inevitable impurities such as Ar may be contained. However, the hydrogen content and the nitrogen content were each determined as the amount in atomic percent based on the amount of (C+H+N) in the film.

The hardness and the Young's modulus of each amorphous carbon-type film shown in Table 1 were measured with a nanoindentation method using a sample including a hard metal as the base material. For the measurement, a nanoindentation hardness tester ("ENT-1100a" manufactured by ELIONIX Co.) was used. Then, using a Berkovich indenter made of diamond, the measurement was performed under given five loads of the measurement loads of 10 to 1 mN, thereby to form a load-unloading curve. Thus, the hardness and the Young's modulus were calculated.

Then, in order to evaluate the resistance to high pressure of contacted surface (durability under high pressure of contacted surface), a sliding test was performed using a ring-on-disk tester. For the ring, there was used a SKH51 (size: 20.0 mm in inside diameter, 25.6 mm in outside diameter, 15.0 mm in height, and 1.5 mm in tip R of the ring). For the disk, there were used SKH51 samples (size: 34.0 mm in diameter×5.0 mm in thickness, and contact area between the ring and the disk: 203 mm$^2$) coated with various amorphous carbon-type films of Table 1. Then, under the conditions of a sliding speed: 1.0 m/s and a vertical load: constant at 200 N, an oil (about 10

From Table 1, it can be considered as follows. In each of Inventive Examples 1 to 3, the N-DLC-type film specified in the present invention is formed. For this reason, seizure does not occur, and the wear amount is also considerably small. In contrast, in each of Comparative Examples 1 to 8, the N-DLC-type film satisfying the specification of the present invention is not formed. For this reason, seizure occurs. Alternatively, even when seizure does not occur, a defective condition such as remarkable wear occurs.

Particularly, in Comparative Examples 1, 2, and 4, the characteristics of each amorphous carbon-type film not including nitrogen added therein are changed according to the hydrogen content. When a sample did not contain hydrogen (i.e., contained neither nitrogen nor hydrogen) (Comparative Example 1), seizure occurred immediately after the start of the sliding test. Whereas, when a sample contained hydrogen but the amount fell short of the specification (Comparative Example 2), the distance until the occurrence of seizure was longer than that of Comparative Example 1. However, seizure occurred. Further, when a sample contained the specified amount of hydrogen (Comparative Example 4), seizure did not occur, but the wear amount was larger than those of Inventive Examples 1 to 3.

Comparative Example 3 indicates as follows: even in the case where the film contains nitrogen in a specified amount, when the hydrogen content is less than 8.0 at %, seizure occurs.

Whereas, Comparative Example 8 is an example in which the hydrogen content is as excessive as 24.5 at %. It is indicated that such an excessive hydrogen content does not cause seizure, but results in a defective condition such as an increase in wear amount of the film.

Comparative Examples 5 to 7 are examples in each of which the hydrogen content is insufficient, and the nitrogen content is excessive. In such cases, as indicated, seizure occurs. Alternatively, although seizure does not occur, a defective condition such as an increase in wear amount of the film occurs.

Example 2

As a base material, for analysis of the hydrogen content and the nitrogen content, a Si substrate was used; and for sliding test evaluation, a mirror-surface-polished SKH51 disk was used. On the base materials, the following deposition was performed in the same manner as in Example 1. First, in the same manner as in Example 1, a Cr film (film thickness: 0.2 μm) and a Cr carbide film (a gradient structure layer of Cr and C, film thickness: 0.5 μm) were sequentially formed as an intermediate layer on the substrate. As a result, the adhesion between the base material and the film (each amorphous carbon-type film, monolayer N-DLC-type film or monolayer DLC-type film) to be deposited next.

On the surface of the intermediate layer, first, an amorphous carbon-type film (DLC-type film, film thickness: 0.9 μm) was formed. Deposition of the DLC-type film was carried out under the conditions of a $CH_4$ flow rate: 1 sccm, and an Ar flow rate: 99 sccm. Then, on the DLC-type film, a N-DLC-type film (film thickness: 0.1 μm) was formed. Deposition of the N-DLC-type film was carried out under the conditions of a $CH_4$ flow rate: 1 sccm, an Ar flow rate: 99 sccm, and a $N_2$ flow rate: 3 sccm. This resulted in a sample in which the amorphous carbon-type lamination film (lamination film) was formed on the surface of the intermediate layer.

For comparison, there was prepared a sample in which a monolayer DLC-type film (film thickness: 1.0 μm) was formed in place of the lamination film. Deposition of the monolayer DLC-type film was carried out under the conditions of a $CH_4$ flow rate: 1 sccm, and an Ar flow rate: 99 sccm. There was also prepared a sample in which a monolayer N-DLC-type film (film thickness: 1.0 μm) was formed in place of the lamination film. Deposition of the monolayer DLC-type film was carried out under the conditions of a $CH_4$ flow rate: 1 sccm, an Ar flow rate: 99 sccm, and a $N_2$ flow rate: 3 sccm.

Using each sample thus obtained, there were performed analysis of the hydrogen content and the nitrogen content of the lamination film, the monolayer N-DLC-type film, or the monolayer DLC-type film, and a sliding test thereof.

First, respective hydrogen contents and nitrogen contents of the N-DLC-type film in the lamination film and the monolayer N-DLC-type film were measured in the same manner as in Example 1. As a result, in any film, the hydrogen content was 11.0 at %, and the nitrogen content was 4.0 at %. Whereas, respective hydrogen contents of the DLC-type film in the lamination film and the monolayer DLC-type film were measured in the same manner as in Example 1. As a result, in any film, the hydrogen content was 11.0 at %.

Then, a sliding test was performed to measure the coefficient of friction of each film. The sliding test was performed using the same ring-on-disk tester as that in Example 1. For the ring, there was used a SKH51 (size, and the like: 20.0 mm in inside diameter, 25.6 mm in outside diameter, 15.00 mm in height, and 1.5 mm in tip R of the ring). For the disk, there was used SKH51 (size: 34.0 mm in diameter×5.0 mm in thickness, and contact area between the ring and the disk: 203 $mm^2$) coated with the lamination film, the monolayer N-DLC-type film, or the monolayer DLC-type film. Then, under the conditions of a sliding speed: 1.0 m/s and a vertical load: constant at 200 N, an oil (about 10 $mm^2$/s in kinematic viscosity at room temperature) was coated on the disk. Thus, a 10000-m sliding test was carried out.

In the sliding test, in the same manner as in Example 1, from the point in time at which the sliding speed became 1.0 m/s and the vertical load became 200 N after 10-minute running-in, 10000-m sliding was carried out. As a result, all of the samples did not undergo seizure, and achieved 10000-m sliding. Further, the mean value of the coefficients of friction after a sliding distance of 9000 m was determined. The results are shown in FIG. 1.

FIG. 1 indicates as follows: when the lamination film is formed, the coefficient of friction is smaller than that in the case where the monolayer DLC-type film or the monolayer N-DLC-type film is formed. The wear depth after the sliding test of the lamination film was measured, and, as a result, was found to be about 0.1 μm. The sliding surface of the lamination film in the latter half of sliding is in a state in which the wear particles generated due to wear of the N-DLC-type film and the wear particles generated due to wear of the DLC-type film by sliding are present in mixture. Such a sliding surface condition is considered to contribute to the implementation of the smaller coefficient of friction than that in the case where the monolayer DLC-type film or the monolayer N-DLC-type film is formed. Namely, the specified lamination film can ensure an excellent wear resistance resulting from the N-DLC-type film shown in Example 1, and can reduce the coefficient of friction together.

As described up to this point, the present invention was described in details, and by reference to specific embodiments. However, it is apparent to those skilled in the art that various changes and modifications may be made without departing from the spirit and scope of the present invention. The present application is based on Japanese Patent Application No. 2008-210670 filed on Aug. 19, 2008, and Japanese Patent Application No. 2009-163659 filed on Jul. 10, 2009, the contents of which are incorporated herein by reference.

The invention claimed is:

1. A sliding member having a nitrogen-containing amorphous carbon lamination film formed on a surface thereof, said carbon lamination film comprising
a nitrogen-containing amorphous carbon film formed by a physical vapor deposition method and comprising hydrogen in an amount of 8.0 at % or more and 12.0 at % or less, and nitrogen in an amount of 3.0 at % or more and 14.0 at % or less, and
an amorphous carbon film containing hydrogen in an amount of 5.0 at % or more and 25 at % or less, and having a nitrogen content of 0 to 0.1 at %,
wherein said amorphous carbon film is formed between said nitrogen-containing amorphous carbon film and said surface.

2. The sliding member according to claim 1, wherein said nitrogen-containing amorphous carbon film has a ratio (H/E) of the hardness H (GPa) and a Young's modulus E (GPa) measured with a nanoindentation method is 0.070 or more and 0.080 or less.

3. The sliding member according to claim 1, wherein said amorphous carbon lamination film comprises two or more pairs of lamination combinations wherein the nitrogen-containing amorphous carbon film and the amorphous carbon film are stacked.

4. The sliding member according to claim 1, being a sliding component of an automobile engine.

5. The sliding member according to claim 1, wherein said nitrogen-containing amorphous carbon film has a hydrogen content ranging from 9.0 at % to 11.0 at %.

6. The sliding member according to claim 1, wherein said nitrogen-containing amorphous carbon film has a nitrogen content ranging from 4.0 at % to 11.0 at %.

7. The sliding member according to claim 1, wherein said nitrogen-containing amorphous carbon film has a hydrogen content of about 10.0 at %.

8. The sliding member according to claim 1, wherein said nitrogen-containing amorphous carbon film has a thickness ranging from 0.5 μm to 1.0 μM.

9. The sliding member according to claim 1, wherein said amorphous carbon film has a hydrogen content ranging from 8.0 at % to 12.0 at %.

10. The sliding member according to claim 1, wherein said nitrogen-containing amorphous carbon film further comprises at least one metal or semimetal element, wherein said metal or semimetal element is Fe, Si, Al, B, a group 4A element, a group 5A element, a group 6A element, or mixtures thereof.

11. The sliding member according to claim 10, wherein the total amount said at least one metal or semimetal element ranges from 2.0 at % to 20.0 at % relative to the total carbon in said nitrogen-containing amorphous carbon film.

12. The sliding member according to claim 1, wherein said amorphous carbon film further comprises at least one metal or semimetal element, wherein said metal or semimetal element is Fe, Si, Al, B, a group 4A element, a group 5A element, a group 6A element, or mixtures thereof.

13. The sliding member according to claim 12, wherein the total amount said at least one metal or semimetal element ranges from 2.0 at % to 20.0 at % relative to the total carbon in said amorphous carbon film.

14. The sliding member according to claim 1, wherein said amorphous carbon film has a thickness ranging from 0.2 μm to 5.0 μm.

15. The sliding member according to claim 14, wherein said amorphous carbon film has a thickness ranging from 0.5 μm to 2.0 μm.

16. The sliding member according to claim 14, wherein said nitrogen-containing amorphous carbon film has a thickness ranging from 0.01 μm to 1.0 μm.

17. The sliding member according to claim 16, wherein said nitrogen-containing amorphous carbon film has a thickness ranging from 0.05 μm to 0.5 μm.

18. The sliding member according to claim 1, further comprising an intermediate layer disposed between said carbon lamination film and said surface.

19. The sliding member according to claim 18, wherein said intermediate layer is a film comprising an elemental substance of Si, Ti, Zr, Cr, W, or Mo, or an oxide, a nitride, or a carbide thereof.

20. The sliding member according to claim 18, wherein the thickness of said intermediate layer ranges from about 0.1 to 1 μm.

* * * * *